United States Patent
Agrawal et al.

(10) Patent No.: US 11,469,709 B2
(45) Date of Patent: Oct. 11, 2022

(54) BIASING SCHEME FOR CONSTANT REGULATED LOCAL OSCILLATOR IN MM-WAVE TRIPLER

(71) Applicant: Intel Corporation, Santa Clara, CA (US)

(72) Inventors: Abhishek Agrawal, Portland, OR (US); Stefano Pellerano, Beaverton, OR (US); Christopher Hull, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/129,483

(22) Filed: Dec. 21, 2020

(65) Prior Publication Data
US 2022/0200532 A1    Jun. 23, 2022

(51) Int. Cl.
*H03D 7/14*       (2006.01)
*H03L 7/099*      (2006.01)
(Continued)

(52) U.S. Cl.
CPC .......... *H03D 7/1458* (2013.01); *H03B 19/14* (2013.01); *H03D 7/1433* (2013.01);
(Continued)

(58) Field of Classification Search
CPC .. H03D 7/1458; H03D 7/1433; H03D 7/1441; H03D 7/165; H03B 19/14; H03L 7/099
See application file for complete search history.

(56) References Cited

U.S. PATENT DOCUMENTS

| 10,116,290 | B1 * | 10/2018 | Wang | H03B 19/14 |
| 11,075,604 | B2 * | 7/2021 | Birkbeck | H03B 19/14 |

(Continued)

OTHER PUBLICATIONS

Kanget, S, "A W-Band Low-Noise PLL With a Fundamental VCO in SiGe for Millimeter-Wave Applications", IEEE Transactions on Microwave Theory and Techniques vol. 62, Issue: 10, (Oct. 2014), 2390-2404.

(Continued)

*Primary Examiner* — Dinh T Le
(74) *Attorney, Agent, or Firm* — Schwegman Lundberg & Woessner, P.A.

(57) ABSTRACT

A biasing scheme for a frequency multiplication circuit, and transceiver using LO signals provided by the frequency multiplication circuit are described. A frequency doubler is cascaded with a mixer to provide a mm-wave oscillator signal. The combination provides a frequency triple that of the LO frequency supplied to the frequency doubler from a PLL. A small-sized replica of the frequency doubler is used to determine biasing of transconductance devices of the frequency doubler. A voltage output of the replica is amplified and the difference between the output and a reference voltage is supplied as feedback to the control terminal of the transconductance devices to bias the transconductance devices to near threshold. The biasing is replicated at the frequency doubler to compensate for PVT variations. A PTAT current source tied to the output of the replica regulates an average output current of the frequency multiplication circuit.

11 Claims, 6 Drawing Sheets

(51) Int. Cl.
  *H03D 7/16* (2006.01)
  *H03B 19/14* (2006.01)
(52) U.S. Cl.
  CPC .......... *H03D 7/1441* (2013.01); *H03D 7/165* (2013.01); *H03L 7/099* (2013.01)

(56) References Cited

U.S. PATENT DOCUMENTS

2019/0158075 A1* 5/2019 Lee .......................... H03K 5/15
2021/0399685 A1* 12/2021 Park .................. H03K 5/00006

OTHER PUBLICATIONS

Li, A, "A 21-48 GHz Subharmonic Injection-Locked Fractional N Frequency Synthesizer for Multiband Point-to-Point Backhaul Communications", IEEE Journal of Solid-State Circuits vol. 49, Issue: 8, (Aug. 2014), 1785-1799.

Pellerano, S, "9.7 A Scalable 71-to-76GHz 64-Element Phased-Array Transceiver Module with 2×2 Direct-Conversion IC in 22nm FinFET CMOS Technology", 2019 IEEE International Solid-State Circuits Conference—(ISSCC), (Feb. 2019), 3 pgs.

"European Application Serial No. 21198817.5, Extended European Search Report dated Mar. 18, 2022", 7 pgs.

Luo, H, et al., "Bulk-compensated technique and its application to subthreshold ICs", Electronic Letters, the Institution of Engineering and Technology, vol. 46, No. 16, (Aug. 5, 2010), 1105-1106.

* cited by examiner

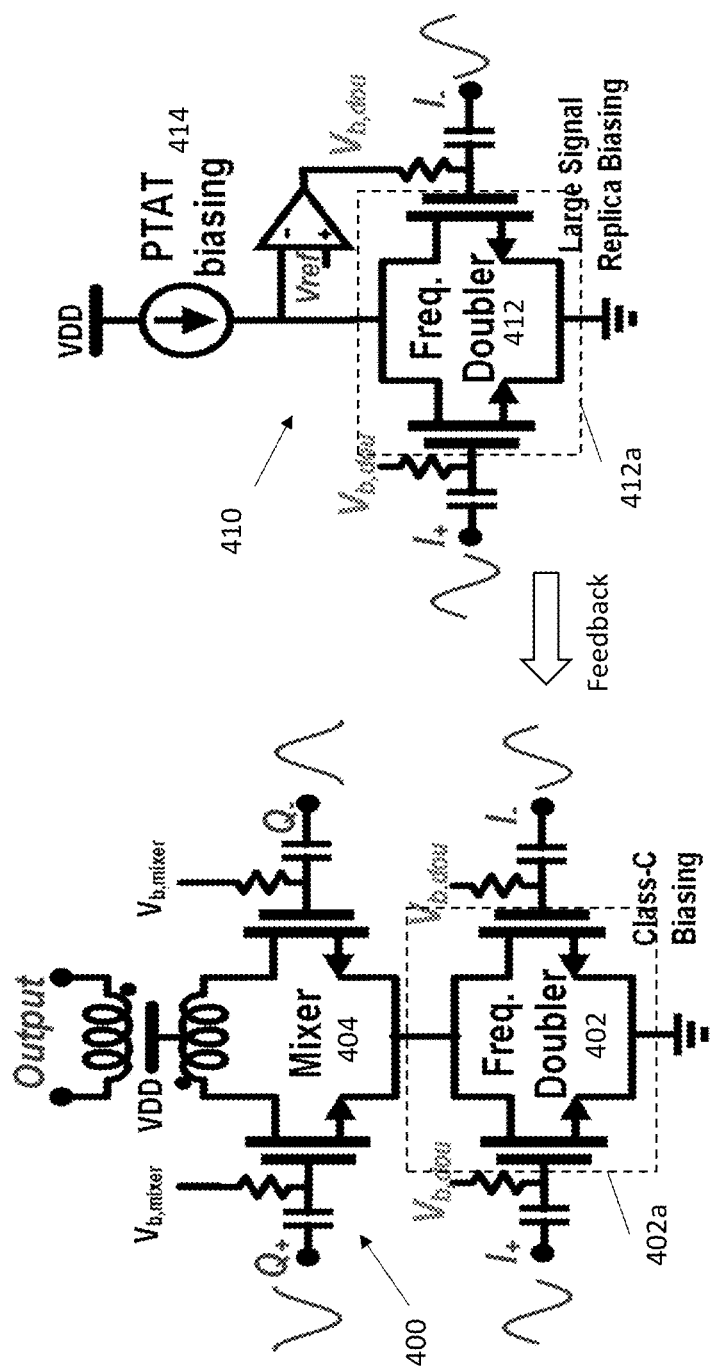

US 11,469,709 B2

BIASING SCHEME FOR CONSTANT REGULATED LOCAL OSCILLATOR IN MM-WAVE TRIPLER

TECHNICAL FIELD

Aspects pertain to communication devices. Some aspects pertain to receivers. Some aspects relate to local oscillator (LO) signal generation. Some aspects relate to mm-Wave LO signal generation.

BACKGROUND

The use of various types of wireless communication devices, such as smart phones and tablets, continues to increase, as does amount of data and bandwidth being used by various applications, such as video streaming, operating on such communication devices. Thus, given the usage, an ever-present desire is to increase the bandwidth used for wireless communications to provide enhanced data services. In some situations, the wireless communication devices may communicate with an access point, such as a base station, via the third-generation partnership project (3GPP) licensed bands using network resources. The UEs may alternately use the unlicensed (Wifi) bands to communicate. Relatively recently, additional mm-wave bands have been allocated for UE communication to support the anticipated demand for both high data rates and a high density of user devices in a particular geographical area. The relatively newly-released 60-GHz band in particular offers benefits and advantages including operation in the unlicensed band, which permits flexible deployment and removes the use of significant capital to obtain a spectrum license. In addition, the 60-GHz band offers secure and virtually interference-free operation due to scoped channel propagation characteristics and the use of steerable narrow beams. The 60-GHz band also offers high level of frequency re-use with 7 GHz of available spectrum. However, issues arise with the advent of any new technology, including band use in the 60-GHz band.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example; but not by way of limitation, various aspects discussed in the present document.

FIG. 4A illustrates a frequency tripler in accordance with some aspects;

FIG. 4B illustrates a large signal biasing scheme in accordance with some aspects;

DETAILED DESCRIPTION

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

Figure 1:
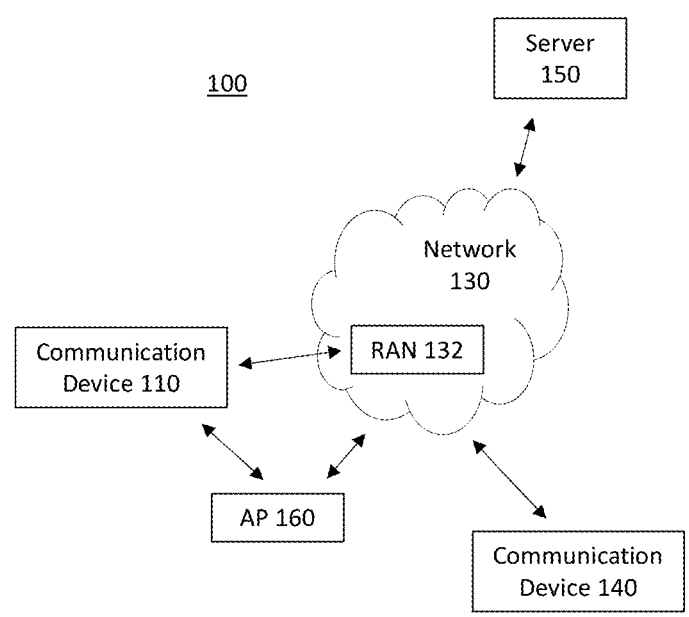
FIG. 1 is a functional block diagram illustrating a system according to some aspects.

FIG. 1 is a functional block diagram illustrating a system according to some aspects. The system 100 may include multiple communication devices 110, 140. In some aspects, one or both the communication devices 110, 140 may be communication devices that communicate with each other directly (e.g., via P2P or other short range communication protocol) or via one or more short range or long range wireless networks 130. The communication devices 110, 140 may, for example, communicate wirelessly locally, for example, via one or more random access networks (RANs) 132, access points (APs) 160 or directly using any of a number of different techniques and protocols, such as WiFi, Bluetooth, or Zigbee, among others. The RANs 132 may contain one or more base stations such as evolved NodeBs (eNBs) and $5^{th}$ generation NodeBs (gNBs) and/or micro, pico and/or nano base stations.

The communication devices 110, 140 may communicate through the network 130 via Third. Generation Partnership Project Long Term Evolution (3GPP LTE) protocols and LTE advanced (LTE-A) protocols, 4G protocols or 5G protocols. Examples of communication devices 110, 140 include, but are not limited to, mobile devices such as portable handsets, smartphones, tablet computers, laptop computers, wearable devices, sensors and devices in vehicles, such as cars, trucks or aerial devices (drones). In some cases, the communication devices 110, 140 may communicate with each other and/or with one or more servers 150. The particular server(s) 150 may depend on the application used by the communication devices 110, 140.

The network 130 may contain network devices such as a gateway (e.g., a serving gateway and/or packet data network gateway), a Home Subscriber Server (HSS), a Mobility Management Entity (MME) for LTE networks or an Access and Mobility Function (AMF), User Plane Function (UPF), Session Management Function (SMF) etc., for 5G networks. The network 130 may also contain various servers that provide content or other information related to user accounts.

Figure 2:
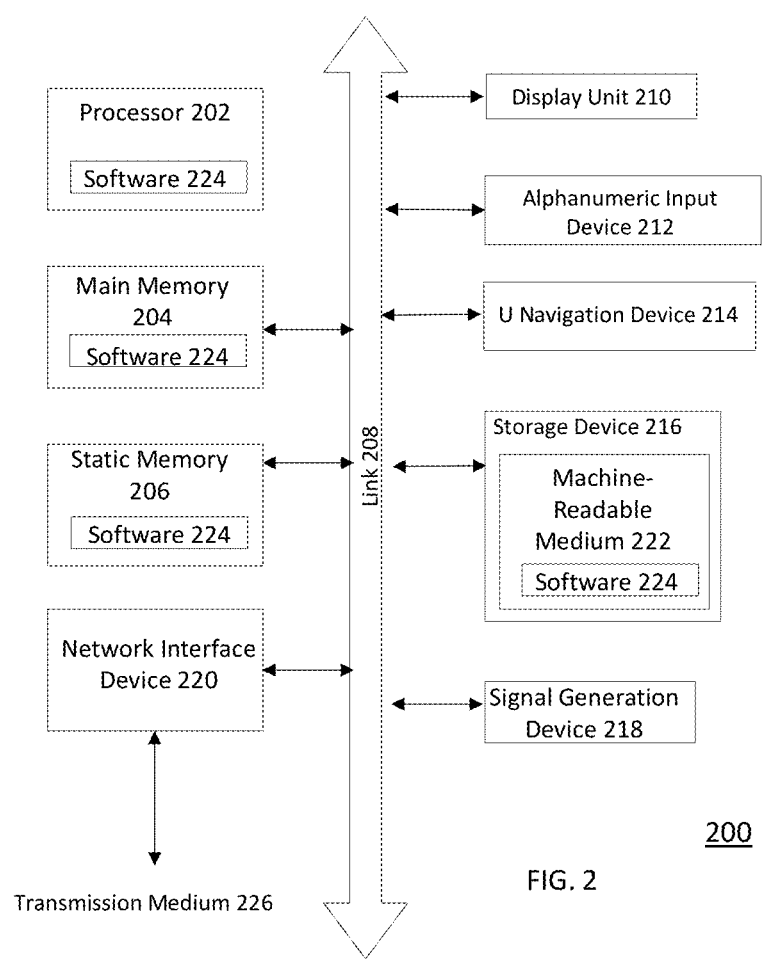
FIG. 2 illustrates a block diagram of a communication device in accordance with some aspects.

FIG. 2 illustrates a block diagram of a communication device in accordance with some embodiments. The communication device 200 may be a communication device such as a specialized computer, a personal or laptop computer (PC), a tablet PC, or a smart phone, dedicated network equipment such as an eNB, a server running software to configure the server to operate as a network device, a virtual device, or any machine capable of executing instructions (sequential or otherwise) that specify actions to be taken by that machine. For example, the communication device 200 may be implemented as one or more of the devices shown in FIG. 1, Note that communications described herein may be encoded before transmission by the transmitting entity (e.g., communication device, AP) for reception by the receiving entity (e.g., AP, communication device) and decoded after reception by the receiving entity.

Examples, as described herein, may include, or may operate on, logic or a number of components, modules, or mechanisms. Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The communication device 200 may include a hardware processor (or equivalently processing circuitry) 202 (e.g., a central processing unit (CPU), a GPU, a hardware processor core, or any combination thereof), a main memory 204 and a static memory 206, some or all of which may communicate with each other via an interlink (e.g., bus) 208. The main memory 204 may contain any or all of removable storage and non-removable storage, volatile memory or non-volatile memory. The communication device 200 may further include a display unit 210 such as a video display, an alphanumeric input device 212 (e.g., a keyboard), and a user interface (UI) navigation device 214 (e.g., a mouse). In an example, the display unit 210, input device 212 and UI navigation device 214 may be a touch screen display. The communication device 200 may additionally include a storage device (e.g., drive unit) 216, a signal generation device 218 (e.g., a speaker), a network interface device 220, and one or more sensors, such as a global positioning system (GPS) sensor, compass, accelerometer, or other sensor. The communication device 200 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 216 may include a non-transitory machine readable medium 222 (hereinafter simply referred to as machine readable medium) on which is stored one or more sets of data structures or instructions 224 (e.g., software) embodying or utilized by any one or more of the techniques or functions described herein. The instructions 224 may also reside, completely or at least partially, within the main memory 204, within static memory 206, and/or within the hardware processor 202 during execution thereof by the communication device 200. While the machine readable medium 222 is illustrated as a single medium, the term "machine readable medium" may include a single medium or multiple media (e.g., a centralized or distributed database, and/or associated caches and servers) configured to store the one or more instructions 224.

The term "machine readable medium" may include any medium that is capable of storing, encoding, or carrying instructions for execution by the communication device 200 and that cause the communication device 200 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Radio access Memory (RAM); and CD-ROM and DVD-ROM disks.

The instructions 224 may further be transmitted or received over a communications network using a transmission medium 226 via the network interface device 220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as WiFi (802.11a, 802.11b, 802.11e, 802.11g, 802.11h, 802.11i, 802.11n, 802.16, 802.16d, 802.16e); IEEE 802.15.4 family of standards, a Long Term Evolution (LTE) family of standards, a Universal Mobile Telecommunications System (UMTS) family of standards, P2P networks, a next generation (NG)/5G standards among others. Some embodiments may be used in conjunction with one or more types of wireless communication signals and/or systems, for example, Radio Frequency (RF), Infra-Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), Extended GPRS, Code-Division Multiple Access (CDMA), Wideband CDMA (WCDMA), CDMA 2000, Multi-Carrier Modulation (MDM), Discrete Multi-Tone (DMT), Bluetooth, ZigBee, or the like. In an example, the network interface device 220 may include one or more physical jacks (e.g., Ethernet, coaxial, or phone jacks) or one or more antennas to connect to the transmission medium 226.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processing circuitry" or "processor" as used herein thus refers to, is part of, or includes circuitry capable of sequentially and automatically carrying out a sequence of arithmetic or logical operations, or recording, storing, and/or transferring digital data. These may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Figure 3:
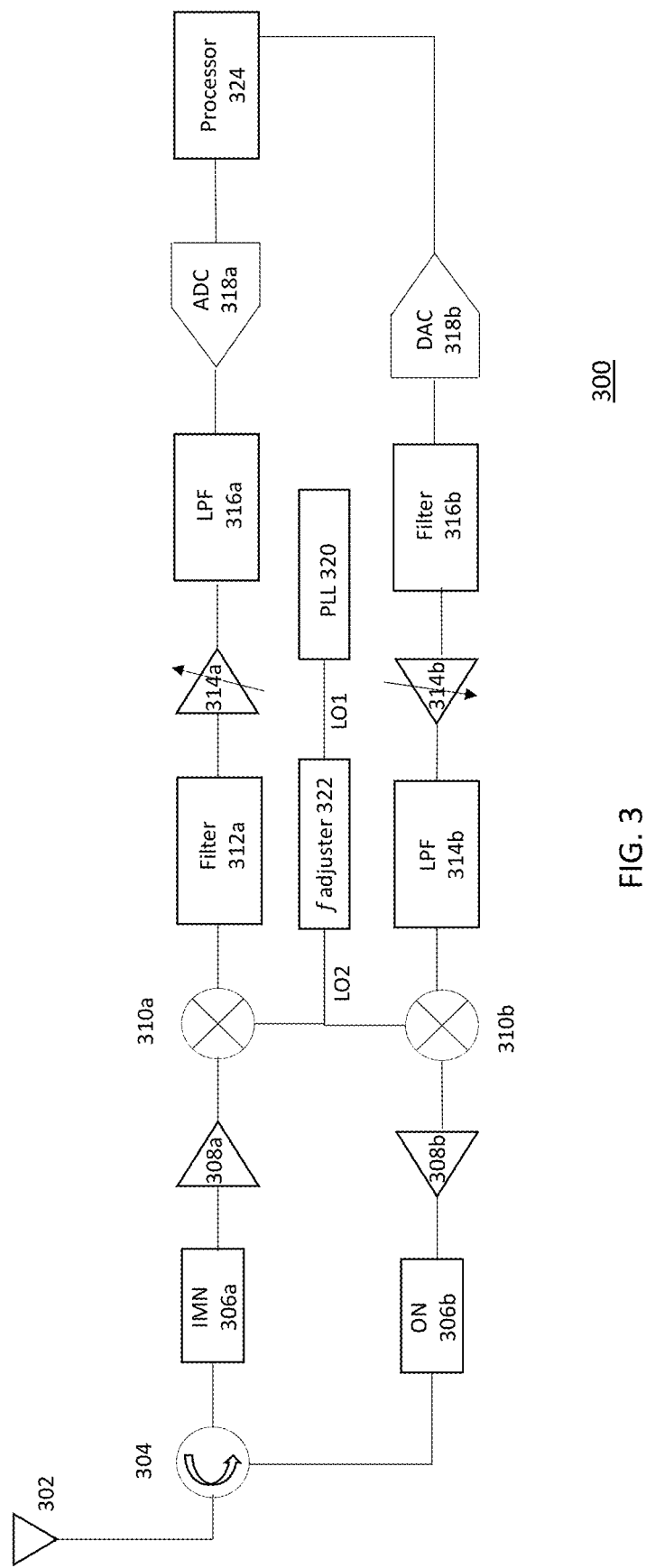
FIG. 3 illustrates a communication device in accordance with some aspects.

FIG. 3 illustrates a communication device in accordance with some aspects. Note that only some of the components of the communication device 300 are shown in FIG. 3 for convenience. For example, although only one receiver path and transmitter path are shown, multiple paths of each may be present for differential in-phase (I+, I−) signals and quadrature-phase (Q+, Q−) signals, for example. The components shown may be disposed or fabricated on a single chip or die or may be provided as different chips on a printed circuit board. In some embodiments, one or more of the components shown in FIG. 3 may not be present.

The communication device 300 contains one or more antennas 302. If multiple antennas are present, the antennas may be used for communication in different frequency bands and/or may be used as a phased array, for example. An isolator 304 or other switching device may be used to isolate the transmitter and receiver paths. The receiver path may contain an input matching network 306a that may contain additional elements such as other filters, buffers, amplifiers et al. Similarly, the transmitter path may contain an output network 306a that may contain additional elements such as other filters, buffers, amplifiers et al.

As shown, the input matching network 306a may be connected to a low noise amplifier (LNA) 308a to amplify the signal received by the antenna 302 without introducing an excessive amount of noise into the receiver path. The output network 306b may be connected to a power amplifier (PA) 308b to amplify the received signal for transmission by the antenna 302.

The LNA 308a in the receiver path and the PA 308b in the transmitter path may each be coupled to a respective mixer 310a, 310b. The mixer 310a in the receiver chain may be used to downconvert signals from the LNA 308a to baseband signals for further processing. Similarly, the mixer 310b in the transmitter chain may be used to upconvert signals to be supplied to the PA 308b from baseband signals to radio frequency (RF) for transmission by the antenna 302.

The mixers 310a, 310b may be supplied with LO signals generated by an LO signal generator, shown as a phase-lock loop (PLL) 320 in FIG. 3. The PLL 320 may include, for example, a voltage-controlled oscillator (VCO) that supplies a VCO signal to a phase comparator A reference voltage may also be supplied to the phase comparator and the output from the phase detector provided to a lowpass filter before being supplied to the VCO. The phase detector thus compares the phase of the reference voltage and the phase of the VCO signal, adjusting the VCO to keep the phases matched. The PLL 320 may be, for example, a digital phase lock loop in which a digital phase detector such as an exclusive or (XOR) may be used.

In some cases, the LO signal from the PLL 320 (LO1) may be adjusted by a frequency adjuster 322 before being supplied to the mixers 310a, 310b as an adjusted LO signal (LO2). For example, the frequency adjuster 322 may contain a half-frequency divider to reduce the LO signal when the LO signal is generated at a frequency higher than that desired (e.g., when the communication device 300 is configured to transmit/receive in the 2.4 GHz band but the PLL, 320 is configured to generate LO signals about 5 GHz range), in another embodiment, such as the embodiment described below, the frequency adjuster 322 may contain a frequency multiplier, such as a frequency doubler or tripler. This permits LO signals generated by the PLL 320 at about 20 GHz to be tripled to provide LO signals at the mm-wave frequencies, Although not shown, multiple PLLs and/or frequency adjusters may be used to provide LO signals in different bands and/or to the different paths. Although shown as symmetric, in some embodiments the transmission and reception frequencies may be different (e.g., in different bands). The PLL 320 and frequency adjuster 322 may provide LO signals to the mixers 310a, Slob for communication in different frequency hands (e.g., different wireless local area network (WLAN) bands such as 900 MHz, 2.4 GHz, 3.6 GHz, 4.9 GHz, 5 GHz, 5.9 GHz and 60 (GHz (the E-band)).

Thus, the frequency adjuster 322 used to provide mm-wave LO signals may be a non-oscillating block (not inside the PLL 320) that generates an output frequency that is a multiple of the input frequency. The multiplication ratio may be 2, 3, or higher. As the ratio increases, the conversion gain may decrease, the output power decrease, and the input power increase. One type of multiplier is a harmonic generator, which may use a high VCO output power to obtain high output power at the higher harmonic of interest. In addition, the strong fundamental tone of the VCO may leak through the multiplier and affect the mixer or system performance so a bandpass filter (not shown in FIG. 3) may be used to filter out the unwanted tones.

In the receiver path, the downconverted signals from mixer 310a may be provided to a baseband filter 312a. The baseband filter 312a may have a predetermined bandwidth, which may be fixed or adjustable. In some embodiments, if adjustable, the bandwidth of the baseband filter 312a may be selectable between $2^n*20$ MHz, where n=0, 1, 2 or 3 (i.e., 20 MHz, 40 MHz, 80 MHz, or 160 MHz), although other values may be possible. Thus, the signals provided from the baseband filter 312a may be bandpass limited around the baseband. The signals from the baseband filter 312a may then be amplified. As shown, a variable gain amplifier (VGA) 314a may be used to generate the amplified baseband signals.

To further reduce spurious high frequency signals from the baseband filter 312a, the filtered signals from the baseband filter 312a that have been amplified by the VGA 314a may be supplied to a lowpass filter 316a. The lowpass filter 316a may be, for example, a passive pole formed from an RC circuit, with a variable resistor in series with and a capacitor to ground coupled with the variable resistor. Alternatively, the LPF 316a (and 316b) may be an anti-aliasing filter to prevent aliasing of out-of-band signals and noise after sampling. Of course, in other embodiments more complex circuits may be used to filter out any signals outside of the selected bandwidth of the baseband filter 312a.

The signals from the lowpass filter 316a may be supplied to an analog-to-digital converter (ADC) 318a. In some embodiments, additional circuit elements, such as sample-and-hold (S&H) and finite impulse response (FIR) filter circuitry, may be present so that the signals from the lowpass filter 316a may be supplied to the S&H and FIR filter circuitry. In this case, the S&H circuit may sample the voltage from the lowpass filter 316a and holds that value for a predetermined amount of time while the FIR filter may filter out switching transients caused by the S&H circuit while providing the output value. This may provide a steady input to the ADC 318a for at least the minimum amount of time to stabilize the output from the ADC 318a.

The ADC 318a may have a bandwidth matched to that of the baseband filter 312a or may have a bandwidth of the maximum selectable bandwidth of the baseband filter 312a. The output from the ADC 318a may include, for example, 12 bits for each of the complex (i.e., each of the T and Q) signals. The ADC 318a may convert the complex analog signals into digital signals for further processing by a processor, such as a digital signal processor (DSP) 324.

In the transmitter path, the DSP 324 may produce digital signals ultimately for transmission from the antenna 302. The digital signals from the DSP 324 may be converted to analog voltages by a digital-to-analog converter (DAC) 318 before being supplied to a lowpass filter 316b, amplified by a VGA 314b and then supplied to a baseband filter 312b. The signals from the lowpass filter 316b may then be upconverted by the transmission mixer 310b. The baseband filter 312b and lowpass filter 316b in the transmitter path may be similar to the baseband filter 312a and lowpass filter 316a in the receiver path, and thus may have similar characteristics (e.g., bandwidth, passband).

In general, circuit design for mixing includes tradeoffs among various parameters including gain, power dissipation, linearity, noise, maximum voltage swing and speed. As above, a frequency adjuster 322 may be used to adjust the LO signal from the PLL 320, which may be used for min-wave communications. Unfortunately, at mm-wave frequencies, generating LO signals directly by using a mm-wave fundamental VCO is limited due to poorer phase noise performance from higher loss caused by passive elements (RC) and smaller achievable frequency tuning range to cover entire band. Thus, one approach is to generate LO at lower frequency (around 20 GHz) and then use a mm-wave frequency multiplier. In some embodiments, higher harmonic frequencies in a frequency multiplier may be generated by biasing devices (transistors) of the multiplier near class-C region (in sub-threshold region) and with a large input signal swing excitation.

Class-C amplifiers are biased so that the output current is zero for more than one half of an input signal cycle with the transistor idling at its cut-off point. Since the transistor has exponential output current characteristics near the sub-threshold region, the output power of the transistor is sensitive to the bias voltage supplied to the base or gate of the transistor. This is to say that the output power of the transistor may vary significantly across process, voltage and temperature (PVT) variations, causing the LO swing to vary. However, a large variation in LO swing can result in large variation in the noise figure, linearity and gain of the mixer. For an active mixer used in a transmitter (or transmitter path such as that shown in FIG. 3), reducing the LO swing may result in reduced output power, third order intercept point (IIP3) and higher noise floor at a power amplifier output; whereas a large LO swing may degrade IIP3 as switching quad transistors may cause the transistors to enter the linear region. In a receiver (or receiver path such as that shown in FIG. 3) implemented with a passive mixer, a reduced LO swing may result in a higher noise figure, and lower gain and linearity. Therefore, a well-controlled PVT-compensated LO swing is desirable at the mixer input to maintain mixer performance across PVT.

Traditional approaches limit the LO swing variation by calibrating the bias voltage applied to the transistor base/gate manually and overdesigning LO buffers to meet swing requirements at slow and high temperature corners for transistors when processing a semiconductor wafer on which the transistors and other circuitry is fabricated. This, however, may lead to an increase in circuit design (and processing) complexity, as well as in area and power consumption of the water. To this end, a PVT-insensitive biasing scheme may be used to address this by sensing the large signal device performance, i.e., proportional to its actual output power and control the bias voltage using feedback. This may result in regulating output power across PVT. The biasing scheme is demonstrated herein for mixer-based frequency tripler generating LOs for an E-band transceiver. Note that although the biasing scheme is demonstrated for a frequency tripler architecture, a similar scheme can be applied to any circuit driven in large signal region including frequency doubler, quadruplet etc. and class B, C and AB power amplifiers.

In some cases, the bias voltage for a frequency tripler may be generated by a large device that is biased near the sub-threshold region using a proportional-to-absolute temperature (PTAT) current source and is able to compensate threshold voltage variation across process. However, as the device has exponential output current relationship in sub-threshold region, the output power is sensitive to bias voltage and difficult to compensate large signal PVT. Additionally, the degraded output power at higher temperature from reduced mobility may be unable to be compensated by a PINT current bias source, a scheme used for a linear amplifier.

Furthermore, manual calibration used to bias the frequency multiplier for each corner may seriously compromise the robustness of the overall system. Due to a large output power variation, additional buffer stages may be used to compensate for the reduced LO power at the frequency multiplier output at both the slow and high temperature corners. This may lead to an increase in both area and power consumption. In addition, with the added buffer stage, the LO buffer may suffer from an even larger LO output power at fast corner, which may compromise both performance and voltage breakdown reliability limits. In this case, a robust biasing scheme may be used to maintain constant LO power generation from the frequency multiplier output that can reduce manual calibration of significantly across PVT.

Instead, an architecture can be used that provides a constant LO output power across PVT by sensing the large signal characteristic of a replica device and applying feedback to regulate the input bias to maintain a constant large signal DC current, i.e., proportional to the output power in the frequency triplet. Additionally, a PLAT compensation may be applied to the large signal DC current to compensate the output power degradation from reduced mobility at high temperature. This biasing scheme decreases the tripler output power variation across PVT and thus removes both the area and power overhead associated with additional LO buffer stages that would have used to compensate reduced tripler output power at the slow and high temperature corner. This may ensure robust mixer performance from a constant input LO power while saving both area and power consumption in the LO buffers. As the tripler biasing is automatically adjusted to the correct value to produce a constant output power, the complexity of manual calibration across PVT variations may be reduced.

In a simplified schematic of a mixer-based frequency tripler and a basing scheme, the drain of a transistor forming the frequency tripler is coupled with the gate of the transistor, In this case, PTAT biasing is provided to the gate of the transistor via the drain.

FIG. 4A illustrates a frequency tripler in accordance with some aspects. As shown, the frequency tripler 400 contains a frequency doubler 402 coupled with a mixer 404.

The frequency doubler 402 includes a pair of transconductance devices to which differential signals are provided. In some embodiments, the transconductance devices are matched metal-oxide-semiconductor field effect transistors (MOSFETs). As shown, the transconductance devices may be N-type MOS (NMOS) transistors. In other embodiments, matched P-type MOS (PMOS) transistors or npn or pnp bipolar junction transistors (BJTs) may be used.

As shown, the differential signals are differential in-phase (I+, I−) signals. The differential I signals are provided to the gates of the NMOS transistors through a capacitor. The differential I signal frequency is an LO signal having a base frequency to be tripled. The LO signal is provided from the PLL (not shown in FIG. 4A).

The source of the NMOS transistors may be coupled to ground. The drain of the NMOS transistors may be coupled together and coupled to the mixer 404 so that the mixer 404 is cascaded with the frequency doubler 402.

The gate of each NMOS transistor is biased by applying a doubler bias voltage between the capacitor and the gate. The doubler bias voltage is selected such that the NMOS transistor is biased in the Class C range. That is, as above, the NMOS transistor is biased below the turn-on voltage of the NMOS transistor at the near sub-threshold region such that when the input I signal is on the positive voltage swing, a portion of the I signal is sufficient to allow the NMOS transistor to turn on. This means that only the peaks of the input I signal are amplified and are available at the output. The mode operates for less than one-half cycle of the I signal and, while highly efficient and able to produce a high peak power, Class C biasing provides poor linear amplification. The frequency doubler 402 is driven by a large signal swing to enhance the second harmonic current generation at the output of the frequency doubler 402. The output of the frequency doubler 402 is multiplied by fundamental components at the mixer 404 to produce signals at the third harmonic of the LO signal from hard switching of the NMOS transistors between the states.

The mixer 404 also includes a pair of transconductance devices to which other differential signals are provided. The transconductance devices may be NMOS transistors, as in the frequency doubler 402. The transconductance devices may match (be of the same type as) those of the frequency doubler 402. The frequency doubler 402 and mixer 404 may be formed on the same substrate using the same processing techniques, for example.

As shown, the other differential signals are differential quadrature-phase (Q+, Q−) signals. Like the frequency doubler 402, the differential Q signals are provided to the gates of the NMOS transistors of the mixer 404 through a capacitor. The capacitor of the mixer 404 may have the same characteristics as that of the frequency doubler 402. The differential Q signal frequency is a phase-shifted version of the LO signal supplied to the gate of the NMOS transistors of the frequency doubler 402. The quarter-wavelength shift of the differential Q signals may be provided, for example, using buffers or inverters in series to delay the LO signal before supplying the LO signal to the gate of the mixer 404. Note that in other embodiments, the differential Q signals may be supplied to the gates of the NMOS transistors of the frequency doubler 402 and the differential I signals may be supplied to the gates of the NMOS transistors of the mixer 404.

The source of the NMOS transistors of the mixer 404 may be coupled to the drains of the NMOS transistors of the frequency doubler 402. The drains of the NMOS transistors may be coupled to ends of a transformer.

The gate of each NMOS transistor of the mixer 404 is biased by applying a mixer bias voltage between the capacitor and the gate. The mixer bias voltage, like the doubler bias voltage, is selected such that the NMOS transistor is biased in the Class C range.

The mixer 404, like the frequency doubler 402, also generates its ow third harmonic component from hard switching. From the in-phase summation of third harmonic currents generated from both the mechanisms, the mixer 404 achieves larger saturated output power and better power added efficiency. As the NMOS transistors of the frequency doubler 402 are biased near the Class C region, the generated second harmonic current and the tripler output power is sensitive to the input bias voltage and can vary across PVT. Thus, a biasing scheme may be used to generate a well-defined output power across PVT variations.

In some biasing schemes, the doubler bias voltage may be generated by using a large transistor that is biased near the deep sub-threshold region (in which the IDS vs VGS-VT transfer region is linear on a log scale or VGS is less than a few hundred mV of threshold voltage) that tracks the threshold voltage across PVT variation. Due to large signal operation, the NMOS transistors of the frequency doubler 402 operate in linear, saturation and cut off regions respectively during each LO period. As the NMOS transistors of the frequency doubler 402 are biased near their threshold voltage, the large signal characteristic of the NMOS transistors of the frequency doubler 402 are sensitive to exponential output current characteristic and variation in conduction angle across PVT. The conduction angle is the angle of the sine wave at which conductance occurs. Thus, this scheme may be inadequate to compensate device performance variation as the NMOS transistors of the frequency doubler 402 are driven in the large signal region and have different large signal gains, compression characteristics, and DC power consumption than if the NMOS transistors of the frequency doubler 402 are operated in the small signal region. Additionally, the reduction in output power resulting from the mobility degradation when the NMOS transistors of the frequency doubler 402 are operating at higher temperature is difficult to compensate using a single PTAT current source as the bias voltage generated from a large device operating in the sub-threshold region does not change a significant amount with the increase in the PTAT current source operating at higher temperature. This results in large variation in output power at the frequency tripler output across variations in temperature.

To this end, FIG. 4B illustrates a large signal biasing scheme in accordance with some aspects. The biasing circuit 410 may contain similar circuitry as the frequency tripler 400, as described in more detail below. In particular, the biasing circuit 410 may contain a secondary frequency doubler 412 which is a reduced-size replica of the frequency doubler 402. In particular, devices in a core 412a of the secondary frequency doubler 412 are reduced size devices in a core 402a of the frequency doubler 402. The secondary frequency doubler 412 includes a pair of transconductance devices to which the differential I signals are supplied through a capacitor. The transconductance devices are matched to each other and to those of the frequency doubler

402. Thus, the secondary frequency doubler 412 may contain a pair of secondary NMOS transistors. The secondary NMOS transistors may be biased using a doubler bias voltage supplied to a gate of the secondary NMOS transistors through a resistor.

The source of the secondary NMOS transistors may be coupled to ground. The drain of the secondary NMOS transistors may be coupled together and coupled to a PTAT biasing current source 414 so that the PTAT biasing current source 414 is cascaded with the secondary frequency doubler 422. The PTAT biasing current source 414 may also be supplied to an amplifier to provide the doubler bias voltage. In particular, as shown the PTAT biasing current source 414 may be coupled to the inverting input of the amplifier while a reference voltage may be coupled to the non-inverting input of the amplifier. The output of the amplifier may be coupled with the resistor to the gate of each secondary NMOS transistor as well as the gate of each NMOS transistor of the frequency doubler 402.

The biasing circuit 410 may thus closely track the large signal performance of the NMOS transistors across PVT using a closed loop. In particular, the biasing circuit 410 may essentially be a small-scale replica of the NMOS transistors but be driven by the same large signal input to produce large signal output currents. The size of the replicas (the secondary NMOS transistors) can be scaled down by a significant amount (e.g., 5, 10 or 20 times) to save power consumption and reduce overall loading on the input signals. The ratio between the NMOS transistors and the secondary NMOS transistors may depend on the size of the NMOS transistors and the fabrication technology used to fabricate both. That is to retain similar characteristics, the NMOS transistors and the secondary NMOS transistors may be fabricated at the same time, that is using the same processes on the same layers of the multilayer structure, preferably as physically close as possible given the circuit design layout of the multilayer structure.

As shown in FIG. 4B, the average of the output current of the secondary frequency doubler 412 may be regulated to a reference current (the PTAT current source) by comparing the output voltage to a reference voltage using the amplifier and controlling the doubler input bias. During large signal excitation, the average current at the output of the secondary frequency doubler 412 may be proportional to the current generated at higher harmonics. Thus, by regulating the average output current, the current at second harmonic may also be regulated. This results in constant $P_{SAT}$ power at the output of the frequency tripler 400. The PTAT biasing current source 414 can be used to compensate for performance degradation at higher temperature. The feedback loop between the secondary frequency doubler 412 and the PTAT biasing current source 414 may ensure that the average large signal current is increased proportional to the PTAT current.

Figure 5A:
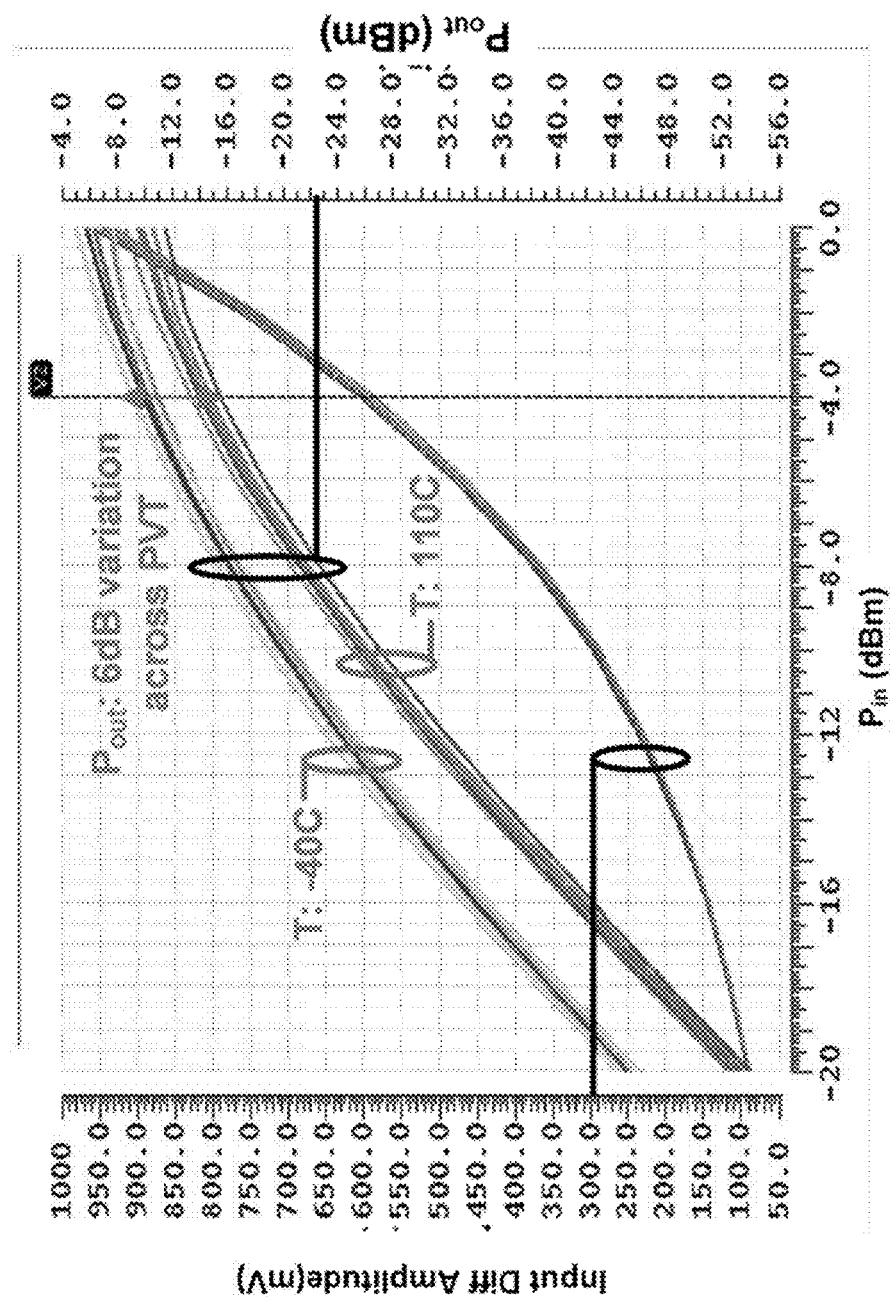
FIG. 5A illustrates frequency tripler performance using a conventional biasing scheme.

FIG. 5A illustrates frequency tripler performance using a conventional biasing scheme. As indicated by the plot, the input power is swept at one third frequency (⅓ of the mm-wave frequency) and the output power is plotted across process and temperature variation. As shown, the output saturated power varies 6 dB across process and temperature, essentially across substantially the entire input power range. Note that the output power variation is mainly caused by temperature variation and is reduced by 4 dB at higher temperatures. This can be ideally compensated by increasing the overdrive voltage (the voltage in excess of the threshold voltage) applied to the NMOS transistors in the frequency triplet, and thus increasing the conduction angle. In some embodiments, the increase in overdrive voltage from a PTAT current source at higher temperature is minimal as the large device used to generate bias voltage is in sub-threshold region.

Figure 5B:
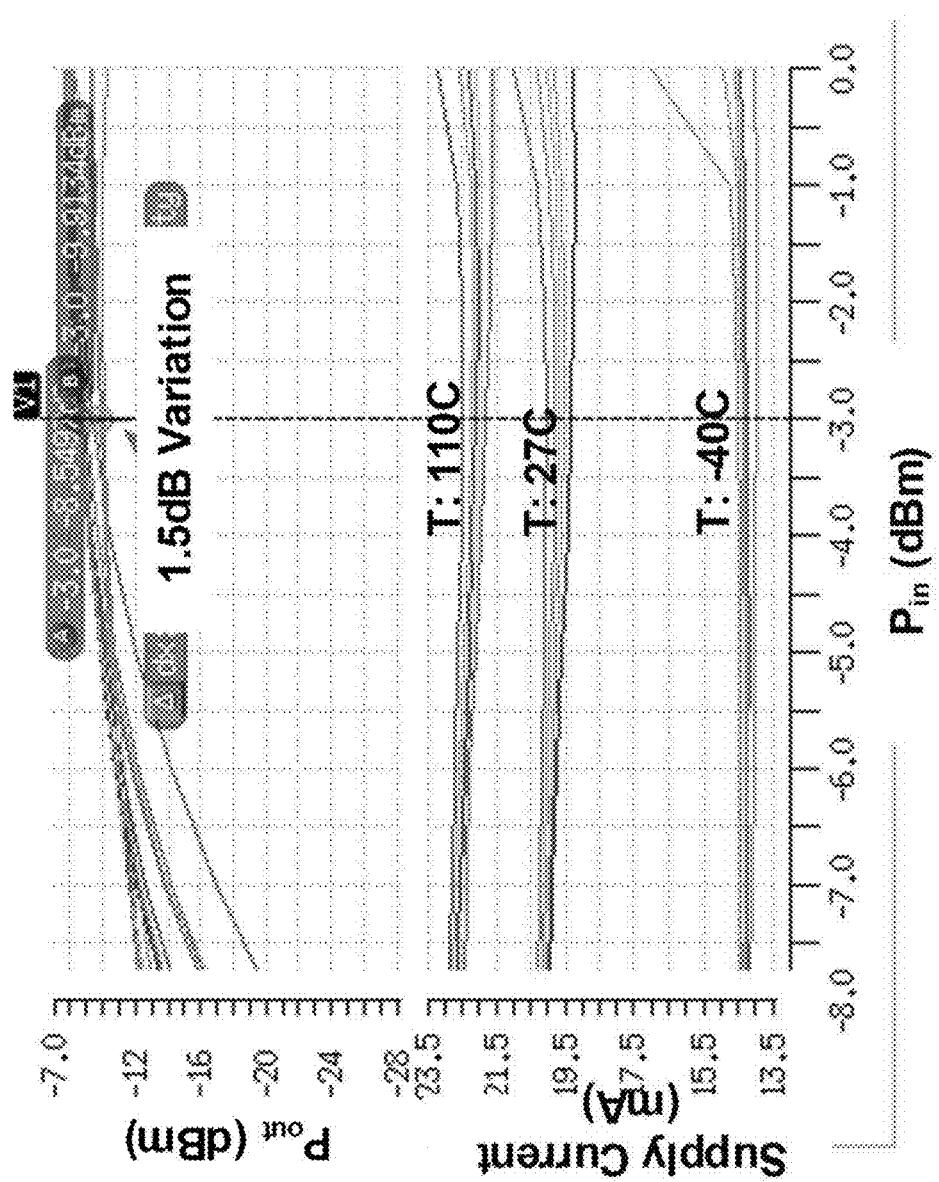
FIG. 5B illustrates frequency tripler performance using large signal feedback based biasing scheme in accordance with some aspects.

FIG. 5B illustrates frequency tripler performance using large signal feedback based biasing scheme in accordance with some aspects. The performance of the large signal feedback based biasing scheme shown in FIGS. 4A and 4B is shown in FIG. 5B. As can be seen, the output saturated power variation is reduced to 1.5 dB across both process and temperature, a significant decrease from the performance shown in FIG. 5A. This confirms the large signal regulation of output power using the feedback loop shown in FIG. 4B. Additionally, as a PTAT current source is used in FIG. 4B, the tripler power consumption is increased with temperature, thereby compensating for mobility degradation and producing constant output power.

Note that although the above has been described with regard to a frequency tripler, a similar technique may be used in other frequency multiplier structures if the structures use the same biasing scheme. For example, additional frequency doublers or multipliers, each with an independently controllable voltage bias may be added to the structure shown in FIG. 4A. Each frequency doubler may use a voltage bias controlled by the same or a different secondary frequency doubler. Alternatively, additional multipliers may be provided in which the NMOS transistors are supplied with different phased LO signals from the I or Q phases are supplied to the gate.

In some embodiments, various ones of the various components and modules described above may comprise software-based modules (e.g., code stored or otherwise embodied in a machine-readable medium or in a transmission medium), hardware modules, or any suitable combination thereof. A hardware module is a tangible (e.g., non-transitory) physical component (e.g., a set of one or more microcontrollers or microprocessors or other hardware-based devices) capable of performing certain operations. The one or more modules may be configured or arranged in a certain physical manner. In various embodiments, one or more microcontrollers or microprocessors, or one or more hardware modules thereof, may be configured by software (e.g., through an application or portion thereof) as a hardware module that operates to perform operations described herein for that module.

In some example embodiments, a hardware module may be implemented, for example, mechanically or electronically, or by any suitable combination thereof. For example, a hardware module may include dedicated circuitry or logic that is permanently configured to perform certain operations. A hardware module may be or include a special-purpose processor, such as a. FPGA or an ASIC. A hardware module may also include programmable logic or circuitry that is temporarily configured by software to perform certain operations. As an example, a hardware module may include software encompassed within a CPU or other programmable processor. It will be appreciated that a decision to implement a hardware module mechanically, electrically, in dedicated and permanently configured circuitry, or in temporarily configured circuitry (e.g., configured by software) may be driven by cost and time considerations.

In various embodiments, many of the components described may comprise one or more modules configured to implement the functions disclosed herein. In some embodiments, the modules may constitute software modules (e.g., code stored on or otherwise embodied in a machine-readable medium or in a transmission medium), hardware modules, or any suitable combination thereof. A "hardware module"

is a tangible (e.g., non-transitory) physical component (e.g., a set of one or more microprocessors or other hardware-based devices) capable of performing certain operations and interpreting certain signals. The one or more modules may be configured or arranged in a certain physical manner. In various embodiments, one or more microprocessors or one or more hardware modules thereof may be configured by software (e.g., an application or portion thereof) as a hardware module that operates to perform operations described herein for that module.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

The description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments. Moreover, although embodiments have been described with reference to specific example embodiments, it will be evident that various modifications and changes may be made to these aspects without departing from the broader scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein, Other embodiments may be utilized and derived therefrom, such that structural and logical substitutions and Changes may be made without departing from the scope of this disclosure. This Detailed Description, therefore, is not to be taken in a limiting sense, and the scope of various aspects is defined only by the appended claims, along with the full range of equivalents to which such claims are entitled.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject mailer lies in less than all features of a single disclosed aspect. Thus, the following claims are hereby incorporated into the Detailed Description, with each claim standing on its own as a separate aspect.

What is claimed is:

1. A frequency multiplication circuit comprising:
a frequency multiplier circuit containing first matched transistors, the frequency multiplier circuit configured to receive differential local oscillator (LO) signals of a first frequency and produce a harmonic signal having a second frequency, the second frequency being a first multiple of the first frequency;
a mixer circuit cascaded with the frequency multiplier circuit, the mixer circuit having mixer matched transistors configured to receive other differential LO signals of the first frequency and the harmonic signal and produce another harmonic signal having a third frequency, the third frequency being a mm-wave frequency that is a second multiple of the first frequency; and
a frequency multiplier biasing circuit that is a reduced-sized replica of the frequency multiplier circuit, the frequency multiplier biasing circuit having second matched transistors, the frequency multiplier biasing circuit configured to control biasing of the first matched transistors via a difference between an output voltage of the frequency multiplier biasing circuit and a reference voltage and application of an output of the difference to the first and second matched transistors.

2. The frequency multiplication circuit of claim 1, wherein the differential LO signals are in-phase signals (I+, I-), the other differential LO signals are quadrature-phase signals (Q+, Q-), and the frequency multiplier biasing circuit is supplied with the in-phase signals.

3. The frequency multiplication circuit of claim 1, wherein the first and second matched transistors and the mixer matched transistors are N-type metal-oxide-semiconductor (NMOS) transistors.

4. The frequency multiplication circuit of claim 3, wherein the biasing of the first matched transistors is Class C region biasing supplied to a gate of each NMOS transistor of the frequency multiplier circuit from an amplifier through a matched resistor, the Class C region biasing supplied to a gate of each NMOS transistor of the frequency multiplier biasing circuit.

5. The frequency multiplication circuit of claim 4, wherein the amplifier has an inverting input coupled to a drain of each NMOS transistor and a non-inverting input coupled to the reference voltage.

6. The frequency multiplication circuit of claim 4, wherein mixer biasing is supplied to a gate of each NMOS transistor of the mixer circuit, the mixer biasing being independent of the Class C region biasing.

7. The frequency multiplication circuit of claim 3, wherein the frequency multiplier biasing circuit comprises a proportional-to-absolute temperature (PTAT) current source coupled to a drain of each NMOS transistor, the PTAT current source configured to provide regulation of an average output current of the frequency multiplier circuit.

8. The frequency multiplication circuit of claim 1, wherein the frequency multiplier biasing circuit is scaled down version of the frequency multiplier circuit having has a size about ten times less than the frequency multiplier circuit.

9. A frequency multiplication circuit comprising:
means for supplying local oscillator (LO) signals; and
means for supplying mm-wave oscillator signals based on the LO signals, the means for supplying mm-wave oscillator signals comprising:
means for generating the oscillator signals using higher-order harmonics of the LO signals; and
means for biasing the means for generating the oscillator signals when the means for generating the oscillator signals is near threshold,
the means for biasing:

replicating, in reduced size, the means for generating the oscillator signals, and configured to track large signal performance of devices of the means for generating the oscillator signals across process, voltage and temperature (PVT) variation to determine biasing of the means for generating the oscillator signals based on biasing of the means for biasing.

10. The frequency multiplication circuit of claim 9, wherein the means for supplying mm-wave oscillator signals is further configured to triple a LO frequency of the LO signal by:

generating second harmonics of the LO frequency, and subsequently generating third harmonics of the LO frequency based on the second harmonics of the LO frequency.

11. The frequency multiplication circuit of claim 9, wherein the means for biasing further comprises means for regulating an average output current of the frequency multiplication circuit using a proportional-to-absolute temperature (PTAT) current of an output of the means for biasing.

* * * * *

UNITED STATES PATENT AND TRADEMARK OFFICE
CERTIFICATE OF CORRECTION

PATENT NO. : 11,469,709 B2  
APPLICATION NO. : 17/129483  
DATED : October 11, 2022  
INVENTOR(S) : Agrawal et al.

Page 1 of 1

It is certified that error appears in the above-identified patent and that said Letters Patent is hereby corrected as shown below:

In the Claims

In Column 14, Lines 53-54, in Claim 8, after "circuit", delete "is scaled down version of the frequency multiplier circuit having"

Signed and Sealed this
Twenty-fifth Day of July, 2023

Katherine Kelly Vidal
*Director of the United States Patent and Trademark Office*